United States Patent [19]

Landreau et al.

[11] Patent Number: 5,024,853
[45] Date of Patent: Jun. 18, 1991

[54] METHOD TO CONTROL THE THICKNESS OF AN ANTIREFLECTION COATING AND IMPLEMENTATION INSTALLATION

[75] Inventors: Jean Landreau, Antony; Hisao Nakajima, Paris, both of France

[73] Assignee: Etat Francais represente par le Ministre, Moulineaux, France

[21] Appl. No.: 544,876

[22] Filed: Jun. 28, 1990

[30] Foreign Application Priority Data

Jul. 6, 1989 [FR] France .................... 89 09119

[51] Int. Cl.$^5$ ............................. C23C 14/54
[52] U.S. Cl. ........................... 427/10; 437/8;
118/708; 118/712; 118/715; 427/162;
427/248.1; 427/2
[58] Field of Search ............ 427/248.1, 10, 162;
437/8; 118/708, 712, 715

[56] References Cited

U.S. PATENT DOCUMENTS 3,846,165 11/1974 Ettenberg ...................... 427/10

FOREIGN PATENT DOCUMENTS 2029017 3/1980 United Kingdom .

OTHER PUBLICATIONS

Somani, Applied Optics, vol. 27, No. 8, Apr. 15, 1988, pp. 1391–1393.
Serenyi, Applied Optics, vol. 26, No. 5, Mar. 1, 1987, pp. 845–849.

Primary Examiner—Richard Bueker
Attorney, Agent, or Firm—Finnegan, Henderson, Farabow, Garrett & Dunner

[57] ABSTRACT

Method to control the thickness of an antireflection coating.

According to the invention, the semi-conductive structure (14) is fed with a constant current (16) and the voltage (24) is measured at its terminals. This voltage passes through a maximum when the reflectivity of the antireflection coating passes through a minimum.

Application for the embodiment of semi-conductive lasers.

7 Claims, 3 Drawing Sheets

METHOD TO CONTROL THE THICKNESS OF AN ANTIREFLECTION COATING AND IMPLEMENTATION INSTALLATION

FIELD OF THE INVENTION

The object of the present invention is to provide a method to control the thickness of an antireflection coating and an implementation installation. This invention can be applied for the lens coating of faces of semiconductive lasers.

BACKGROUND OF THE INVENTION

This antireflection coating is a coating whose index letter n satisfies the equation $n^2 = n_0$ where $n_0$ is the index of the substrate on which said coating is deposited and whose thickness is equal to $\lambda/4n$ where $\lambda$ is the wavelength.

For a given material, the thickness may be adjusted so as to obtain a good antireflection coating. A "good" antireflection coating is one whose reflectivity is less than $10^{-3}$. This extremely low value imposes severe stresses on the thickness which needs to be adjusted to better than $10^{-2}$.

Thus, it is relatively difficult to obtain good antireflection coatings.

There exists one method to control the thickness of such a coating when the latter is deposited on a semiconductive laser. During the depositing operation on one of the transmitting faces of a semi-conductive laser, this laser is fed with a constant current situated above the oscillation threshold of the laser. The light emitted by the latter through the rear face (opposite the one being processed) is measured by a photoreceptor. Its intensity depends on the reflectivity of the front face: the less this face is reflecting, the more losses occur in the resonator and the less intense is the light transmitted by the other face. Accordingly, the measured power reduces along with the reflectivity of the antireflection coating. By detecting the passage of this power through a minimum, it is possible to determine the moment when the antireflection coating presents the reflectivity minimum.

This method is described in the article by M. SERENYI and al and entitled "Directly controlled antireflection coatings for semiconductor lasers" published in the journal "Applied Optics", Mar. 1, 1987, vol. 26, No 5, pp 845-849.

This article describes another technique consisting of exciting the laser below the threshold (and no longer above) and of measuring the intensity of the spontaneous light transmitted through the face being processed (and no longer through the opposing face). In this case, the object here is to find a luminous power maximum, which is obtained when the reflectivity of the coating is at its minimum. This method (A) is less accurate than the previous method (B), as the spontaneous transmission spectrum is wider than the spectrum of the stimulated transmission obtained above the threshold.

These techniques (both A and B) have a large number of drawbacks: first of all, the photoreceptor used needs to be placed in such a way as to collect the light maximum; now, this requirement is incompatible with the need to avoid masking the face to be processed. Then, as this photoreceptor is sensitive to the light emitted in the depositing chamber (evaporation gun or plasma) to mask this stray light, it is necessary to use interferometric filters, which reduce the luminous intensity to be measured; this intensity reduction is all that much more hindering when at its minimum the intensity to be measured is already extremely low. Finally, a strict alignment needs to be effected between the laser and the photoreceptor with the aid of lenses, mirrors, optical fibers, etc., which significantly complicates the installation.

SUMMARY OF THE INVENTION

The object of the present invention is to overcome all these drawbacks. To this end, the invention is able to dispense with these known optical type techniques by adopting an electric method. According to the invention, the voltage is measured at the terminals of the semiconductive laser fed with a constant current above the threshold, and the passage through a maximum of this voltage is detected. This maximum corresponds to the reflectivity minimum of the antireflection coating.

This surprising correlation between an optical variable and an electric variable (the voltage at the laser terminals) may, according to the inventors, be explained as follows.

In a semiconductive laser and for a given injection current, the number of carriers in the active zone is inversely proportional to the number of photons present in the cavity. The density of carriers (namely, the number of carriers per unit of volume) determines the spacing of the Fermi quasi-levels and accordingly the voltage at the laser terminals.

Furthermore, the luminous intensity inside the laser cavity results in an equilibrium between amplification by stimulated emission and the optical losses of the cavity. For a constant injection current, an increase of the losses linked to a reduction of the reflectivity of one of the faces results in a reduction of the luminous intensity inside the cavity. This reduction reduces the stimulated emission, which has the effect of increasing the density of carriers and thus of causing the voltage at the laser terminals to increase.

Consequently, in order to find the best possible antireflection coating, this depends on detecting a voltage maximum at the laser terminals.

The object of the present invention is also to provide an installation for depositing an antireflection coating, this installation implementing the method described above.

BRIEF DESCRIPTION OF THE DRAWINGS

The characteristics of the invention shall appear more readily from a reading of the following description of embodiment examples, given by way of explanation and being in no way restrictive, with reference to the accompanying drawings in which.

DETAILED DESCRIPTION OF THE PREFERRED EMBODIMENTS

Figure 1:
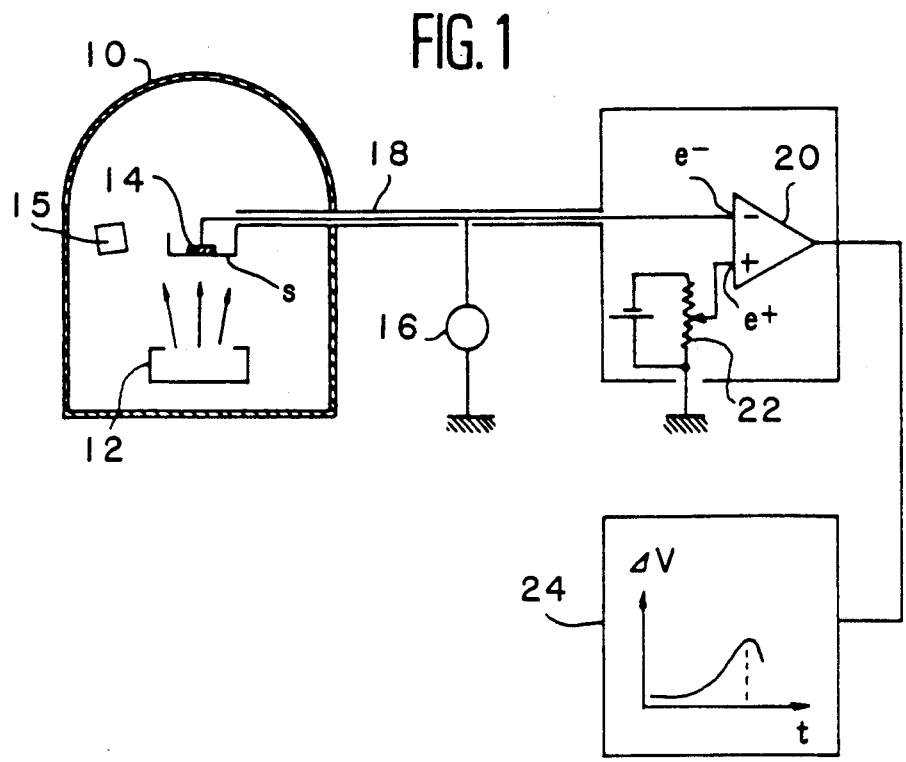
FIG. 1 illustrates an experimental assembly making it possible to follow up the evolution of the voltage during processing.

FIG. 1 represents an experimental assembly whereby the Applicant verified the validity of the invented method. This assembly includes a chamber 10 provided with an evaporation device 12; a laser support s is disposed inside this chamber, a semiconductive laser 14 (one of the emitting faces orientated towards the evaporation device) being disposed on this support. The chamber further includes a device 15 designed to measure the thickness of the deposited coating. The assembly further includes a constant current source 16 connected by a connection 18 to the structure to be processed 14. An operational amplifier 20 has an inversor input e− connected to the current source 16 and a direct input e+ connected to a potentiometer 22. This potentiometer is initially adjusted in order to balance the voltage applied to the inversor input. A recorder 24 connected to the output of the differential amplifier makes it possible to read the voltage delivered by the latter, which is the same as the voltage variation at the terminals of the semiconductive laser 14.

Figure 2:
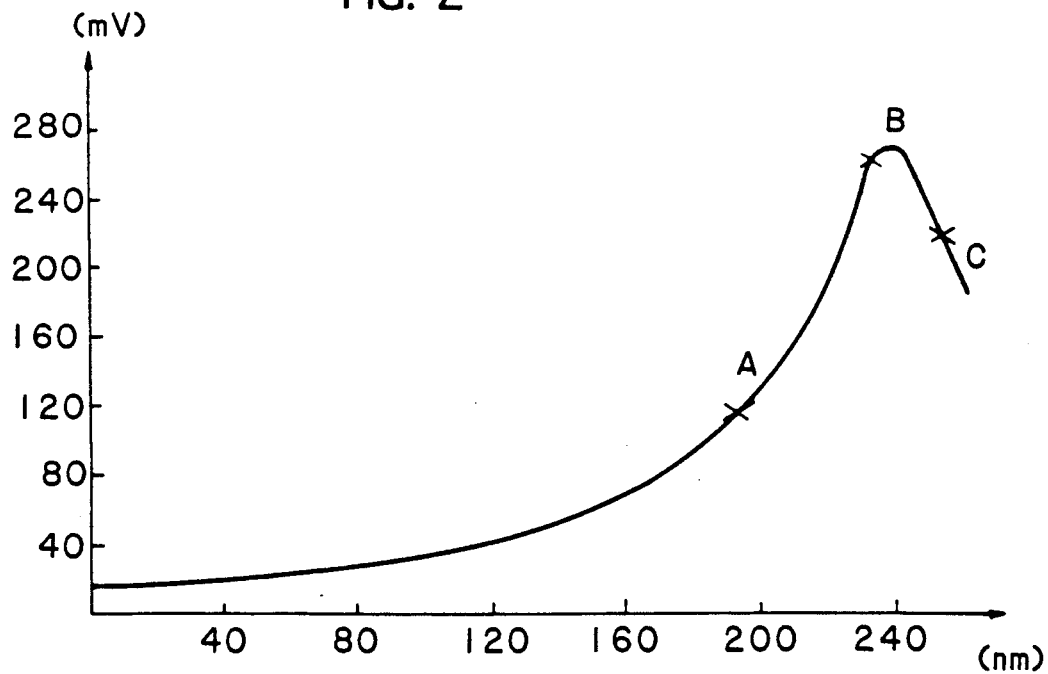
FIG. 2 shows a raised curve with such an assembly.

FIG. 2 shows the curve obtained in the case of depositing SiO as an antireflection material. The thickness ep of the coating measured by the device 15 is laid off as abscissa and expressed in nanometers, and the voltage, delivered by the operational amplifier and laid off as ordinates, is expressed in millivolts. The value of reflectivity has been measured three times opver by interrupting the depositing.

The three points A, B and C marked on the curve correspond to the following values:

|   | thickness (nm) | reflectivity $(10^{-3})$ | laser voltage (mV) |
|---|---|---|---|
| A | 190 | 35 | 10 |
| B | 233 | 0.1 | 23 |
| C | 253 | 5 | 15.2 |

This curve and these values clearly show the correlation between the reflectivity minimum and the voltage maximum at the laser terminals.

Figure 3:
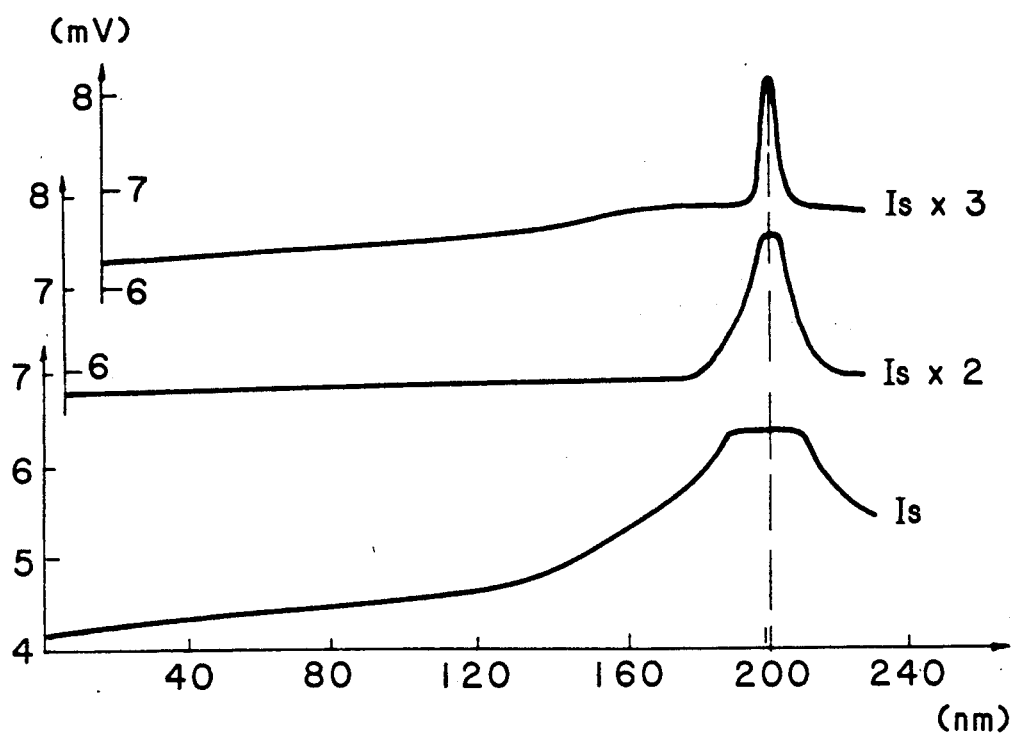
FIG. 3 shows three curves resulting from calculations and corresponding to an index equal to 1.85.
Figure 4:
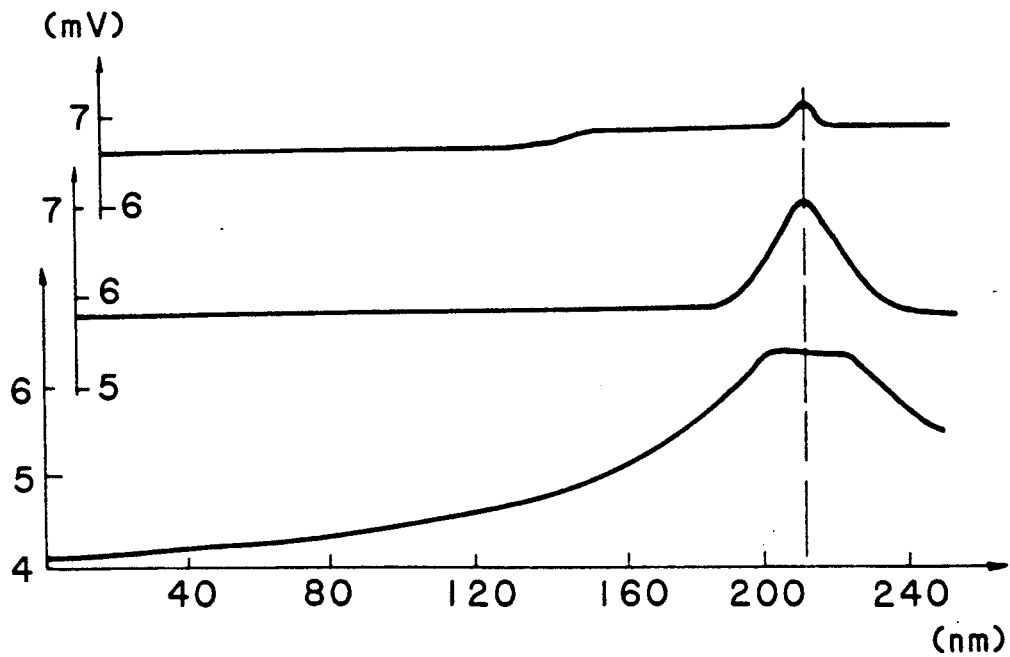
FIG. 4 shows three other curves corresponding to an index of 1.80, FIG. 5 diagrammatically illustrates an installation conforming to the invention with automatic stoppage of processing.

The curves of FIGS. 3 and 4 obtained by the calculation make it possible to better assess the influence of the value of the current of the laser.

For all these curves, the thickness of the coating is expressed in nanometers and is laid off as abscissa, the voltage variation at the terminals of the laser being laid off as ordinates.

The three curves correspond to three current values: the first being equal to the threshold current Is, the second being equal to twice the threshold and the third equal to three times this threshold.

FIG. 3 corresponds to the case where the deposited material has an index equal to 1.85. The minimum reflectivity is equal to $10^{-5}$ for a thickness of about 200 nm.

FIG. 4 corresponds to the case of an index equal to 1.80. The minimum reflectivity is $5 \times 10^{-4}$ for a thickness of about 210 nm.

It shall be observed that a voltage saturation exists when the injected current is equal to the threshold for a reflectivity of $3.10^{-3}$. For an injected current equal to twice the threshold current, this saturation is much less marked and corresponds to a reflectivity of less than $10^{-4}$. Generally speaking it would be preferable to therefore inject a current equal to three times the threshold current. It would then be possible to assess a reflectivity minimum as low as $5 \times 10^{-6}$.

Figure 5:
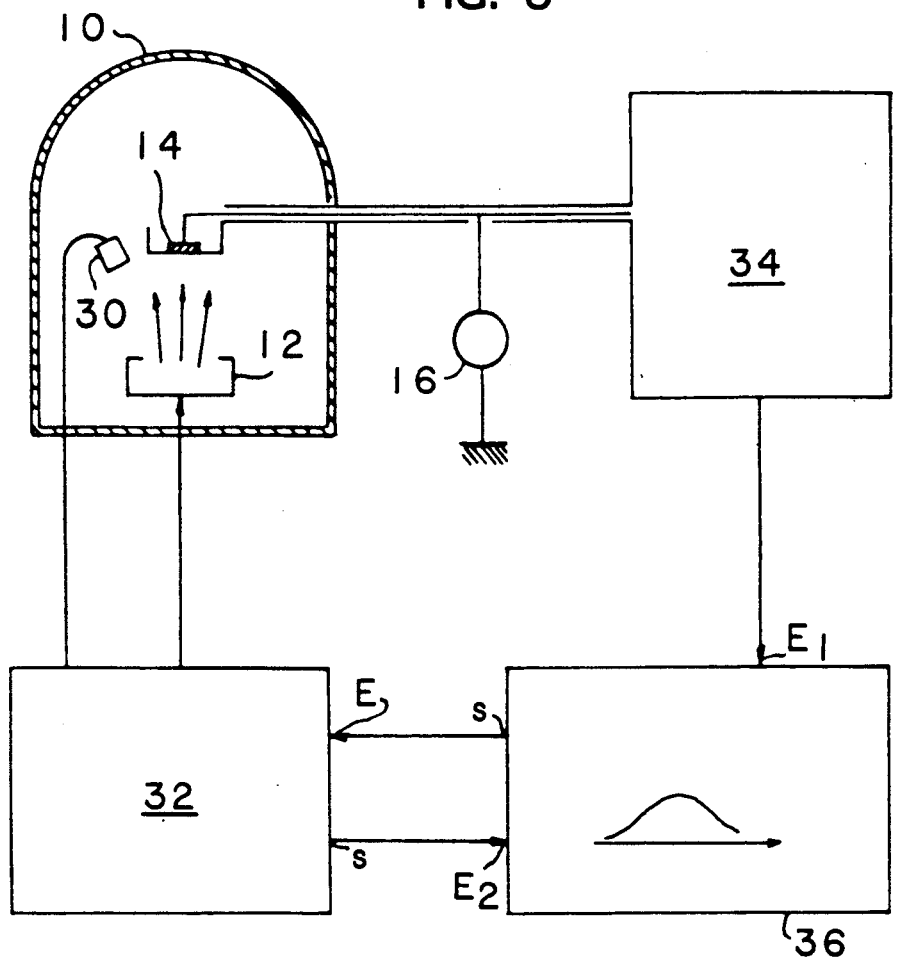

The installation shown on FIG. 5 includes means already represented on FIG. 1, namely a chamber 10, an evaporation device 12, a semiconductive laser 14 and a current source 16. The installation represented further includes a quartz scale 30 able to measure the thickness of the deposited coating, and a device 32 to control the evaporation device with one input E and one output S delivering a signal according to the thickness e measured by the quartz scale 30. A digital voltmeter 34 is connected to the current source. A computer 36 has one first input E1 connected to the voltmeter 34, a second input E2 connected to the output S of the control device 32 and one output S connected to the input E of this same device.

The computer 36 receives the voltage V of the voltmeter 34 and the value of the thickness e delivered by the device 32; it calculates the differential coefficient dV/de and determines the moment when the latter is nil. Consequently, it addresses an evaporation stoppage signal to the device 32, this signal being applied to the input E.

Such a system may be operated with several lasers processed one after the other by means of a mask system. The productivity of the manufacturing process is considerably improved.

As regards the materials to be used, all known and potential future materials are suitable. The article mentioned earlier describes certain operational conditions able to be used within the context of the present invention.

What is claimed is:

1. Method to control the thickness of an antireflection coating when deposited on one of the faces of a semiconductive laser, wherein the laser is fed with a constant current during depositing, this method being characterized in that the voltage is measured at the laser terminals, the passage of this voltage through a maximum being detected, which indicates that the antireflection coating has a thickness providing it with minimum reflectivity.

2. Installation for depositing an antireflection coating on one of the faces of a semiconductive laser and implementing the method according to claim 1, this installation including a depositing chamber equipped with an evaporation device and a laser support, a device to control the evaporation device and a constant current source connected to a connection opening inside the chamber, wherein this installation further includes a device suitably adapted to detect the moment when the voltage at the terminals of the current source passes through a maximum.

3. Installation according to claim 2, wherein it further includes a device able to deliver a stoppage signal to the device for controlling the evaporation device when the voltage passes through a maximum.

4. Installation according to claim 2, wherein it includes a differential amplifier having one inversor input connected to the constant current source and one direct input connected to a potentiometer.

5. Installation according to claim 2, wherein it includes a digital voltmeter.

6. Installation according to claim 5, wherein it further includes a device to measure the thickness of the deposited coating, this device being disposed inside the chamber and being connected to the device for controlling the evaporation device.

7. Installation according to claim 6, wherein it includes a computer having two inputs, one being connected to the voltmeter from which it receives the value of the voltage, the other being connected to the device for controlling the evaporation device from which it receives a signal for measuring the thickness of the deposited coating, this computer calculating the differential coefficient of the voltage with respect to the thickness and having one output connected to the device to control the evaporation device, the computer delivering a stoppage signal on this output when said differential coefficient is nil.

* * * * *